United States Patent
Jen et al.

(10) Patent No.: US 9,570,456 B1
(45) Date of Patent: Feb. 14, 2017

(54) SEMICONDUCTOR INTEGRATED DEVICE INCLUDING CAPACITOR AND MEMORY CELL AND METHOD OF FORMING THE SAME

(71) Applicant: UNITED MICROELECTRONICS CORP., Hsin-Chu (TW)

(72) Inventors: Po-Han Jen, Hsinchu (TW); Chao-Sheng Cheng, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/805,484

(22) Filed: Jul. 22, 2015

(51) Int. Cl.
*H01L 27/07* (2006.01)
*H01L 27/115* (2006.01)
*H01L 49/02* (2006.01)
*H01L 29/423* (2006.01)
*H01L 29/06* (2006.01)
*H01L 29/66* (2006.01)
*H01L 29/788* (2006.01)

(52) U.S. Cl.
CPC ..... *H01L 27/11558* (2013.01); *H01L 27/0733* (2013.01); *H01L 27/11521* (2013.01); *H01L 28/60* (2013.01); *H01L 29/0649* (2013.01); *H01L 29/42324* (2013.01); *H01L 29/66825* (2013.01); *H01L 29/788* (2013.01)

(58) Field of Classification Search
None
See application file for complete search history.

(56) References Cited

U.S. PATENT DOCUMENTS

| | | | |
|---|---|---|---|
| 6,015,984 A | 1/2000 | Leu | |
| 7,022,565 B1 | 4/2006 | Kao | |
| 8,415,721 B2 | 4/2013 | Wang | |
| 2002/0153554 A1 | 10/2002 | Kajita et al. | |
| 2003/0071297 A1* | 4/2003 | Hara | H01L 27/115 257/298 |
| 2006/0134878 A1* | 6/2006 | Kim | H01L 28/91 438/393 |
| 2009/0161291 A1* | 6/2009 | Kim | H01G 4/085 361/305 |

* cited by examiner

*Primary Examiner* — Daniel Whalen
(74) *Attorney, Agent, or Firm* — Winston Hsu; Scott Margo

(57) ABSTRACT

A semiconductor integrated device and a method of forming the same, the semiconductor integrated device includes a substrate, at least one shallow trench isolation, a memory cell device and a poly-insulator-poly capacitor. A capacitor region and a memory cell region are defined on the substrate. The at least one shallow trench isolation is formed in the substrate. The memory cell device is disposed on the at least one shallow trench isolation in the memory cell region and includes a double polysilicon gate. The poly-insulator-poly capacitor is disposed on the at least one shallow trench isolation in the capacitor region, wherein the poly-insulator-poly capacitor directly contacts the at least one shallow trench isolation.

4 Claims, 5 Drawing Sheets

SEMICONDUCTOR INTEGRATED DEVICE INCLUDING CAPACITOR AND MEMORY CELL AND METHOD OF FORMING THE SAME

BACKGROUND OF THE INVENTION

1. Field of the Invention

The invention relates to a semiconductor integrated device and a method of forming the same, and more particularly, to a semiconductor integrated device having a capacitor structure and a memory cell structure, and a method of forming the same.

2. Description of the Prior Art

In semiconductor integrated circuits (ICs), a semiconductor capacitor may be implemented to provide a capacitive component within the design of a semiconductor integrated device. The applications for these capacitors can include mixed signal (analog/digital) devices, radio frequency devices, and even decoupling capacitors for the filtering of high frequency signals and improved noise immunization. In the current semiconductor field, though the fabricating processes are improved with the aim of reaching high yields, it is found that integration of the manufacturing methods of those different kinds of semiconductor devices is very complicated and difficult. Therefore, a method for fabricating a capacitor integrated with a memory cell is still in need.

SUMMARY OF THE INVENTION

It is one of the primary objectives of the present invention to provide a semiconductor integrated device and a method of forming the same, in which, a capacitor structure and a memory cell structure are formed simultaneously to achieve better integration.

To achieve the purpose described above, one embodiment of the present invention provides a method of forming a semiconductor integrated device including following steps. First of all, a substrate having a capacitor region and a memory cell region is provided. Next, a first polysilicon layer is formed on the substrate. Then, the first polysilicon layer is patterned to form a plurality of openings within the capacitor region and the memory cell region respectively. After these, a oxide-nitride-oxide layer is formed on the first polysilicon layer, to fill in each opening in the capacitor region and the memory cell region, and a second polysilicon layer is formed to cover on the oxide-nitride-oxide layer. Finally, the second polysilicon layer is patterned to simultaneously form a poly-insulator-poly (PIP) capacitor in the capacitor region and a memory cell device in the memory cell region.

To achieve the purpose described above, another embodiment of the present invention provides a semiconductor integrated device including a substrate, at least one shallow trench isolation, a memory cell device, and a poly-insulator-poly capacitor. The substrate has a capacitor region and a memory cell region defined thereon. The shallow trench isolation is disposed in the substrate. The memory cell device is disposed on the STI in the memory cell region, wherein the memory cell device includes a double polysilicon gate. The poly-insulator-poly capacitor is disposed on the STI in the capacitor region, wherein the poly-insulator-poly capacitor directly contacts the shallow trench isolation.

To achieve the purpose described above, another embodiment of the present invention provides a semiconductor integrated device including a substrate, a shallow trench isolation, a memory cell device and a poly-insulator-poly capacitor. The substrate has a capacitor region and a memory cell region defined thereon. The shallow trench isolation is disposed in the memory cell region of the substrate. The memory cell device is disposed on the shallow trench isolation, wherein the memory cell device comprises a double polysilicon gate. The poly-insulator-poly capacitor is disposed in the capacitor region of the substrate, wherein the poly-insulator-poly capacitor directly contacts a top surface of the substrate.

The semiconductor integrated device and the method of forming the same of the present invention, the method conducts simultaneously forming a PIP capacitor and a memory cell device, either directly formed on the substrate, on the same STI or on different STIs respectively. Through the present invention, the bottom electrode of the PIP capacitor and the first polysilicon gate (namely, the floating gate) of the memory cell device are both formed through the same polysilicon layer, the ONO layers of the PIP capacitor and the memory cell device are formed through the same ONO layers, and the top electrode of the PIP capacitor and the second polysilicon gate (namely, the controlling gate) of the memory cell device are also both formed through the other polysilicon layer. In this way, the present invention is desired to simultaneously form the PIP capacitor and the memory cell device via a streamlined and cost-and-time saving manufacturing process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
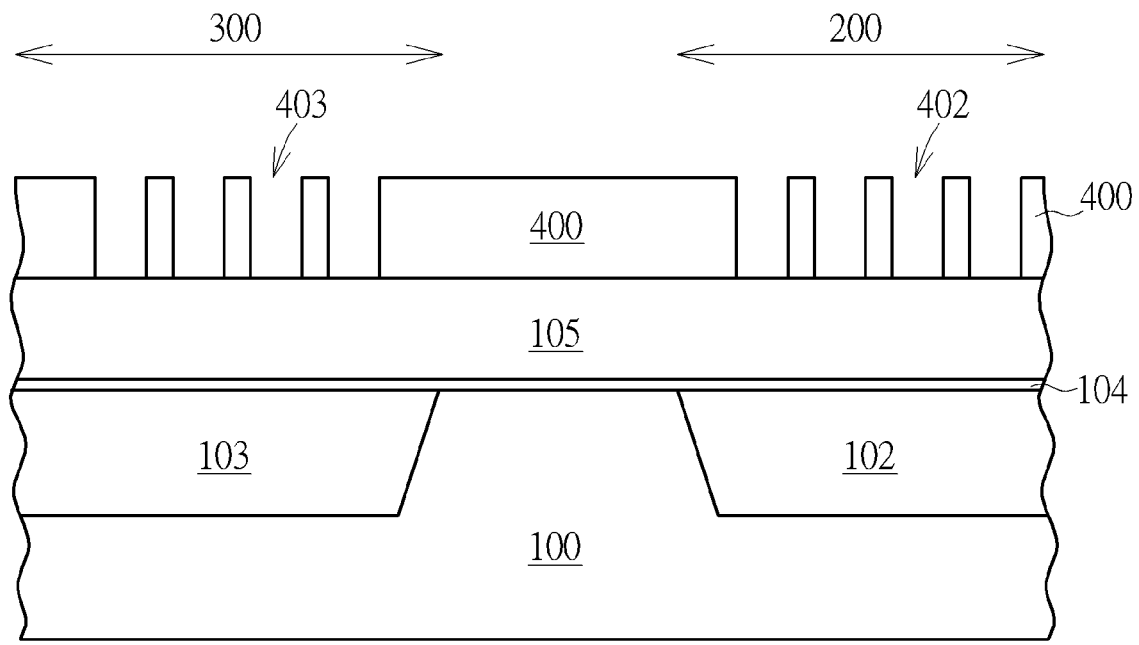
FIG. 1 to FIG. 7 are schematic diagrams illustrating a method of forming a semiconductor integrated device according to a first embodiment of the present invention.

Please refer to FIG. 1 to FIG. 7, which are schematic diagrams illustrating the method of forming a semiconductor integrated device according to a first embodiment of the present invention. Firstly, a substrate 100 is provided. The substrate 100 can be a silicon substrate, an epitaxial silicon substrate, a silicon germanium substrate, a silicon carbide substrate or a silicon-on-insulator (SOI) substrate, but is not limited thereto. A memory cell region 200 is defined on the substrate 100 to form a memory cell device in the following steps, and a capacitor region 300 is defined on the substrate 100 to form a capacitor in the following steps, as shown in FIG. 1.

Next, a least one shallow trench isolation (STI) is formed in the substrate 100. In the present embodiment, a first shallow trench isolation 102 and a second shallow trench isolation 103 are formed respectively in the substrate 100, wherein a portion of the shallow trench isolation 102 surrounds the memory cell region 200 for isolating the memory cell region 200 while the shallow trench isolation 103 is formed in the capacitor region 300 of the substrate 100, but is not limited thereto. In another embodiment, a single shallow trench isolation (not shown in the drawings) may also be formed both in the memory cell region 200 and the capacitor region 300.

Then, a plurality of semiconductor manufacturing processes is carried out sequentially to form a memory cell device 210 in the memory cell region 200 and a capacitor 310 in the resistor region 300. In one embodiment, an insulating layer 104, such as silicon oxide, and a first polysilicon layer 105, may be firstly formed on the entire substrate 100 sequentially, for example through a chemical vapor deposition (CVD) process, an atomic layer deposition (ALD) process or a physical vapor deposition (PVD) process, to cover both of the memory cell region 200 and the capacitor region 300, but is not limited thereto. In another embodiment, the insulating layer 104 may also be formed through a thermal oxidation process.

After these, a patterned mask layer 400 having a plurality of openings 402 and openings 403 is formed on the first polysilicon layer 105. Precisely speaking, the formation of the patterned mask layer 400 may be conducted through a sidewall image transfer (SIT) process, including forming a plurality of patterned sacrificial layers (not shown in the drawings) on a mask material layer (not shown in the drawings), such as a silicon nitride or a silicon oxynitride layer, covered on the entire substrate 100, for example by using a photolithography and etching process, performing a depositing and etching processes sequentially to form a spacer (not shown in the drawings) at sidewalls of each of the patterned sacrificial layers, and then removing the patterned sacrificial layers and performing another etching process by using the spacer as a mask, thereby transferring the patterns of the spacer to the mask material layer underneath. In this way, the patterned mask layer 400 is formed, and a portion of the memory cell region 200 may be exposed from the openings 402 and a portion of the capacitor region 300 may be exposed from the openings 403 simultaneously, as shown in FIG. 1. In a preferred embodiment, the openings 402 may include a plurality of slots (not shown in the drawings) extending along a predetermined direction (e.g. along the Y-axis direction) and openings 403 may include a plurality of holes (not shown in the drawings), for example in an array arrangement, but is not limited thereto. Also, in another embodiment, the slots of the opening 402 and the holes of the opening 403 may be formed individually through a double patterning or a multiple patterning process, for example using photolithography-photolithography-etch (2P1E) steps, or photolithography-etch-photolithography-etch (2P2E) steps, but is not limited thereto.

Figure 2:
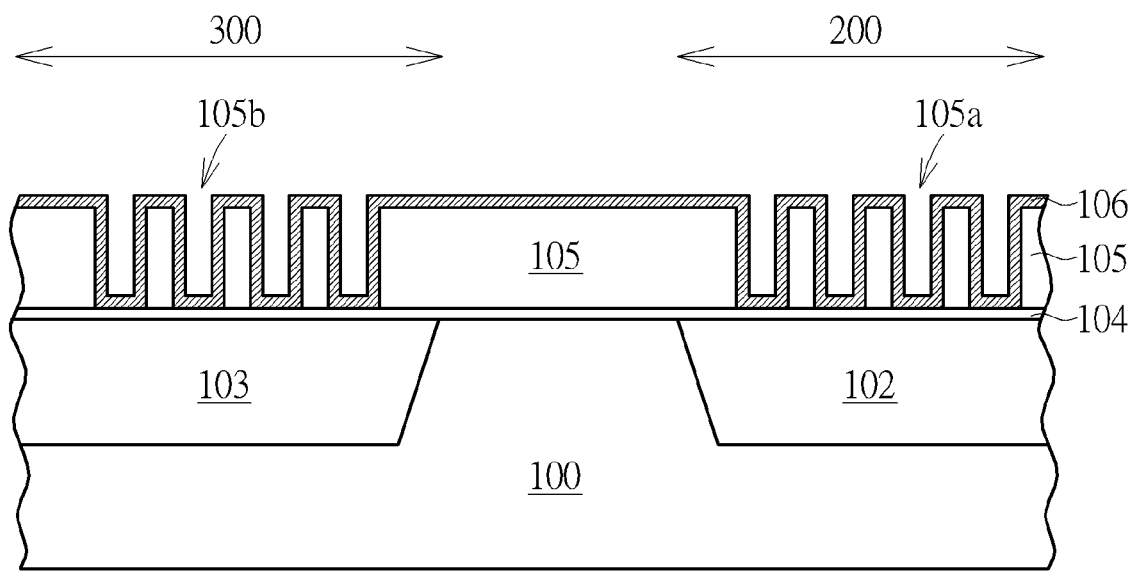

In the following, an etching process is carried out by using the patterned mask layer 400 as a mask, to remove the exposed portions of the first polysilicon layer 105 both in the memory cell region 200 and the capacitor region 300, so that, a plurality of openings 105a, 105b may be formed in the memory cell region 200 and the capacitor region 300 of the first polysilicon layer 105, respectively. In the preferred embodiment of having the patterned mask layer 400 with slots and holes in the memory cell region 200 and the capacitor region 300, the openings 105a may preferably include a plurality of slots extending along the predetermined direction in the memory cell region 200, and the openings 105b may preferably include a plurality of array-arranged holes in the capacitor region 300, but is not limited thereto. Also, in one embodiment, the openings 105a, 105b are preferably extended through the first polysilicon layer 105, such that, a portion of the insulating layer 104 in the memory cell region 200 may be exposed from the openings 105a and a portion of the insulating layer 104 in the capacitor region 300 may be exposed from the openings 105b, and an oxide-nitride-oxide (ONO) layer 106 conformally formed on the first polysilicon layer 105 subsequently may directly contact the exposed portions of the of the insulating layer 104 in the memory cell region 200 and capacitor region 300, as shown in FIG. 2. However, people skilled in the art shall easily realize that the openings formed in the first polysilicon layer 105 of the present invention is not limited to be extended through the first polysilicon layer 105. In another embodiment, at least two etching processes may be performed to form an opening (not shown in the drawings) which is not completely extending through the polysilicon layer 105 in the capacitor region 300. Namely, the opening is completely disposed in the first polysilicon layer 105, and a portion of first polysilicon layer 105 may remain under the opening as a connecting base, such that, an ONO layer (not shown in the drawings) formed subsequently may only contact a portion of the polysilicon layer 105 exposed from the opening and may not directly contact the insulating layer 104 underneath. Otherwise, in another embodiment, an opening (not shown in the drawings) penetrated through the polysilicon layer 105 and the insulating layer 104 may also be formed both in the capacitor region 300, so that, an ONO layer (not shown in the drawings) formed subsequently may directly contact the shallow trench isolation 103 in the capacitor region 300.

Figure 3:
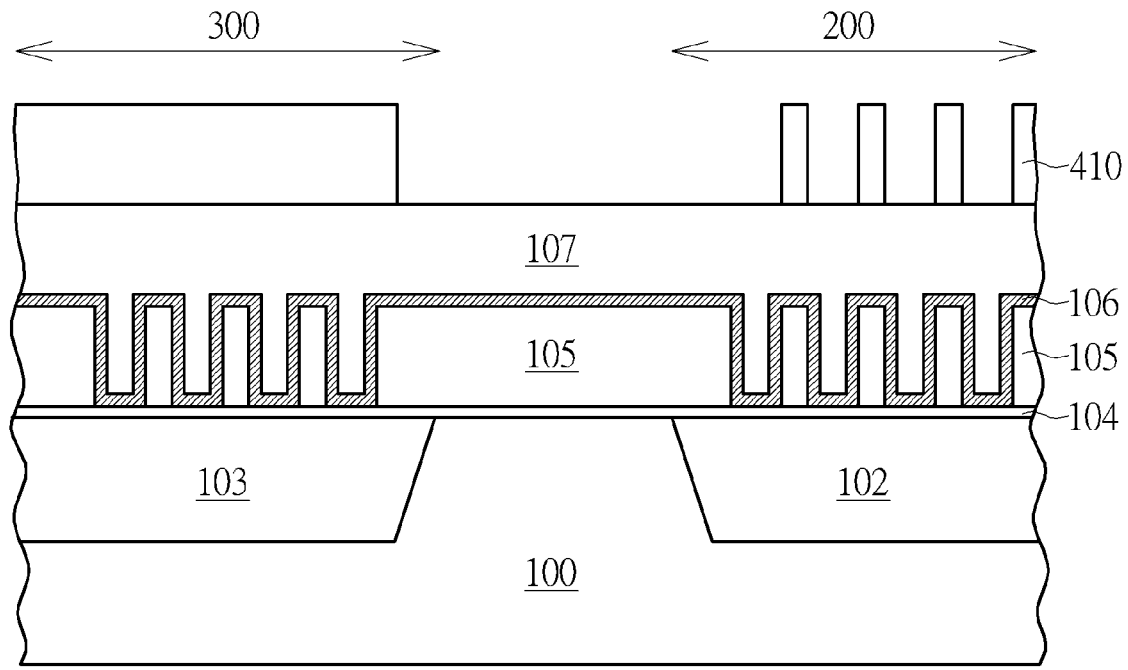

Next, a second polysilicon layer 107 and a patterned mask layer 410 may be formed on the substrate 100 sequentially. Precisely, in one embodiment, the second polysilicon layer 107 covers the entire ONO layer 106 and fills in the openings 105a, 105b, as shown in FIG. 3, and the patterned mask layer 410 covers the entire capacitor region 300 and only a portion of the memory cell region 200, as shown in FIG. 3. It is noted that, the detailed materials and the forming process of the patterned mask layer 410 are substantially similar to that of the patterned mask layer 400 and will not be further detailed herein.

Figure 4:
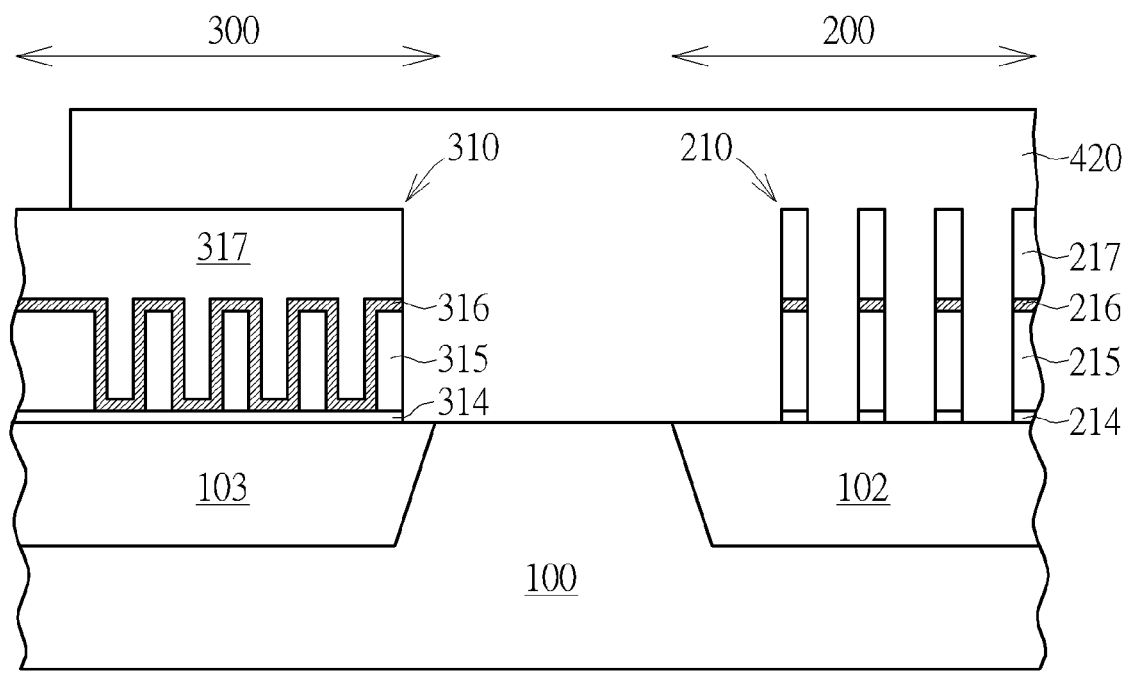

It is noteworthy that, the patterned mask layer 410 formed in the memory cell region 200 includes a plurality of masks which do not overlap with the opening 105a in a projection direction perpendicular to the substrate 100. In this way, after a subsequent etching process is performed, a plurality of the memory cell devices 210 may be formed accordingly in the memory cell region 200, on the first STI 102, as shown in FIG. 4. Each of the memory cell devices 210 includes a tunneling oxide layer 214 namely being formed from the insulating layer 104, a first polysilicon gate 215 being formed from the first polysilicon layer 105, an ONO layer 216 being formed from the ONO layer 106, and a second polysilicon gate 217 being formed from the second polysilicon layer 107, such that, the memory cell devices 210 may be configured as a nor flash device having a control gate (e.g. the second polysilicon gate 217) and a floating gate (e.g. the first polysilicon gate 215).

Figure 7:
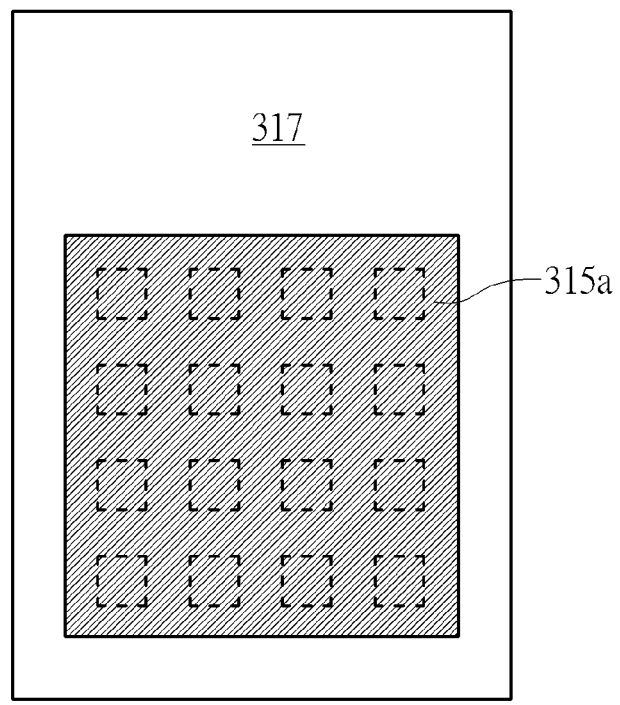

Furthermore, while the memory cell devices 210 are formed, the capacitor 310, namely a poly-insulator-poly (PIP) capacitor, is formed simultaneously in the capacitor region 300 on a pad oxide layer 314 being formed from the insulating layer 104 on the second STI 103, as shown in FIG. 4, and which includes a bottom electrode 315 also being formed from the first polysilicon layer 105, an ONO layer 316 also being formed from the ONO layer 106, and a top electrode 317 also being formed from the second polysilicon layer 107. It is noted that, in the preferable embodiment of having the array-arranged holes in the capacitor region 300, the capacitor 310 may include a trenched bottom electrode 315a having a plurality holes formed therein as shown in FIG. 7, wherein, if an N×N array-arranged holes are formed in the first polysilicon layer in prior steps, the trenched bottom electrode 315a having holes arranged in an N×N array arrangement shown in FIG. 7 may be formed accordingly. However, people skilled in the art shall easily realize that the bottom electrode of the capacitor 310 of the present invention is not limited to the aforementioned shape, and in the embodiment of forming the opening being not completely extended through the polysilicon layer 105, the capacitor 310 may include a comb-liked bottom electrode (not shown in the drawings), but is not limited thereto.

Figure 5:
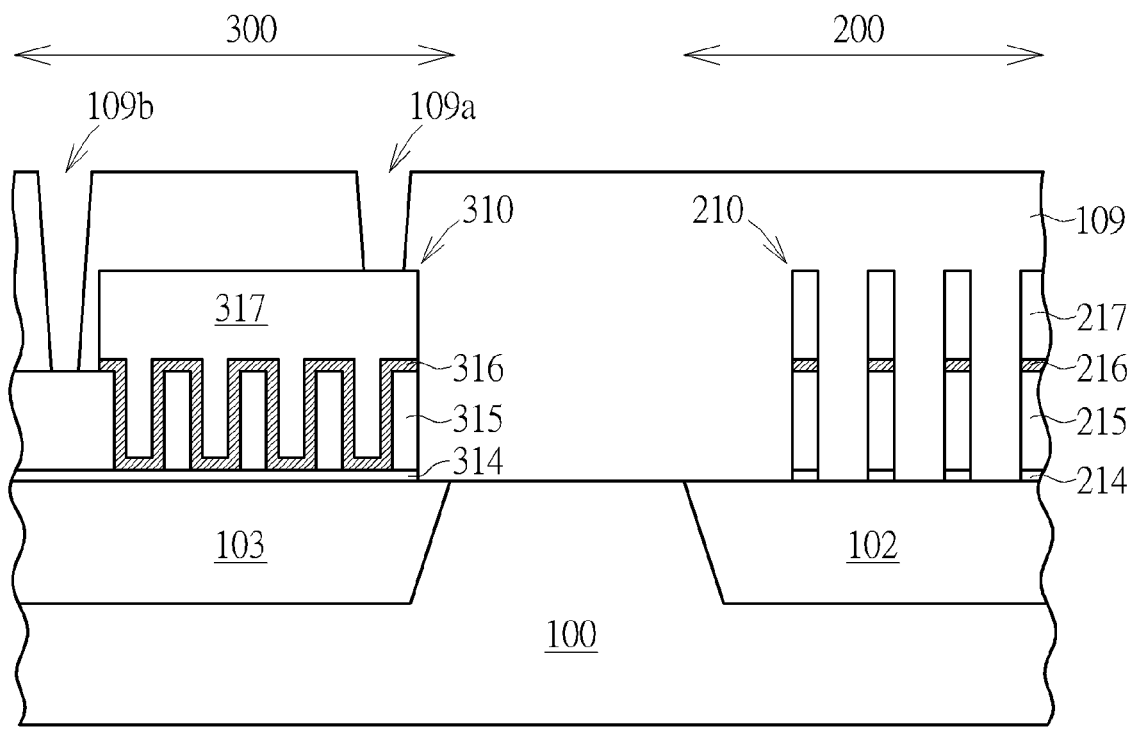

In the following, the top electrode 317 of the capacitor 310 is further patterned to expose a portion of the bottom electrode 315, as shown in FIG. 5. Precisely speaking, a mask layer 420 is formed on the substrate 100 for only exposing a portion of the top electrode 317 of the capacitor 310, as shown in FIG. 4, and then, another etching process is performed to remove the portion of the top electrode 317 and a portion of the ONO layer 316 underneath, thereby forming the patterned top electrode 317a as shown in FIG. 5. It is noted that, the detailed materials and forming process of the patterned mask layer 420 are substantially similar to that of the patterned mask layer 400 and will not be further detailed herein.

Substantially, contact plugs 330, 350 directly contact to the bottom electrode 315 and the top electrode 317a of the capacitor 310 are formed respectively. Firstly, a dielectric layer 109 is formed on the substrate 100, to cover the capacitor 310 and the memory cell devices 210, wherein the dielectric layer 109 may include silicon oxide, TEOS, PETEOS or other low dielectric materials, but is not limited thereto. It is noteworthy that, the dielectric layer 109 has contact holes 109a, 109b, and a portion of the bottom electrode 315 and a portion of the top electrode 317a is respectively exposed from the contact holes 109a, 109b, as shown in FIG. 5.

Figure 6:
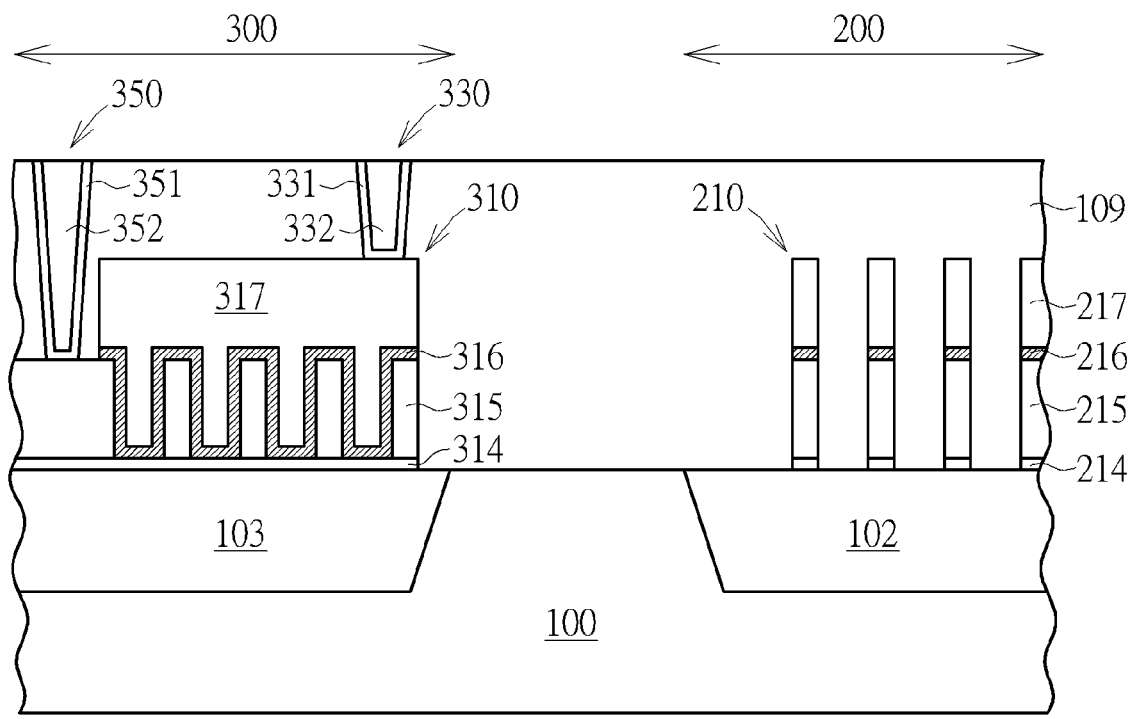

Then, a contact plug forming process may be carried out sequentially in the contact holes 109a, 109b, to form the contact plugs 330, 350 in the contact holes 109a, 109b, for electrically connecting the portion of the bottom electrode 315 and the portion of the top electrode 317a, respectively. The method of forming the contact plugs 330, 350 of the present embodiment, for example, may include sequentially forming a barrier material layer (not shown in the drawings) and a metal material layer (not shown in the drawings) in the contact holes 109a, 109b, and removing a portion of the metal material layer and a portion of the barrier material layer through a planarization process (e.g. a CMP process, an etching process or a combination of both), to form the contact plugs 330, 350 including a barrier layer 331, 351 and a contact metal layer 332, 352 respectively. Thus, the contact plugs 330, 350 may include a top surface level with the dielectric layer 109, as shown in FIG. 6.

Furthermore, in one embodiment of the present invention, the barrier layers 331, 351 may include a titanium (Ti) layer, titanium nitride (TiN) layer, tantalum (Ta) layer or tantalum nitride (TaN) layer; and the contact metal layers 332, 352 may include tungsten (W) or metal having lower resistance, but is not limited thereto. Also, people in the arts shall easily realize that the contact plug forming process of the present invention is not limited to be formed through the above-mentioned steps, but can include other methods which are well known by one skilled in the arts. For example, in another embodiment, before the contact plug forming process, a silicidation process may be performed to conformally form a silicide layer (not shown in the drawings), such as a titanium silicide (TiSi) layer, in the contact holes 109a, 109b, for facilitating the connection between the contact plugs 330, 350 and the capacitor 310.

Through the above-mentioned steps, the semiconductor integrated device of the first embodiment of the present invention is obtained. In the present embodiment, a PIP capacitor and a memory cell device are simultaneously formed on two different STIs, wherein the bottom electrode of the PIP capacitor and the first polysilicon gate (namely, the floating gate) of the memory cell device are both formed through the same polysilicon layer, the ONO layers of the PIP capacitor and the memory cell device are formed through the same ONO layers, and the top electrode of the PIP capacitor and the second polysilicon gate (namely, the controlling gate) of the memory cell device are also both formed through the other polysilicon layer. In this way, the present invention is desired to simultaneously form the PIP capacitor and the memory cell device via a streamlined and cost-and-time saving manufacturing process.

The following description will detail the different embodiments of the method of forming the semiconductor integrated device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
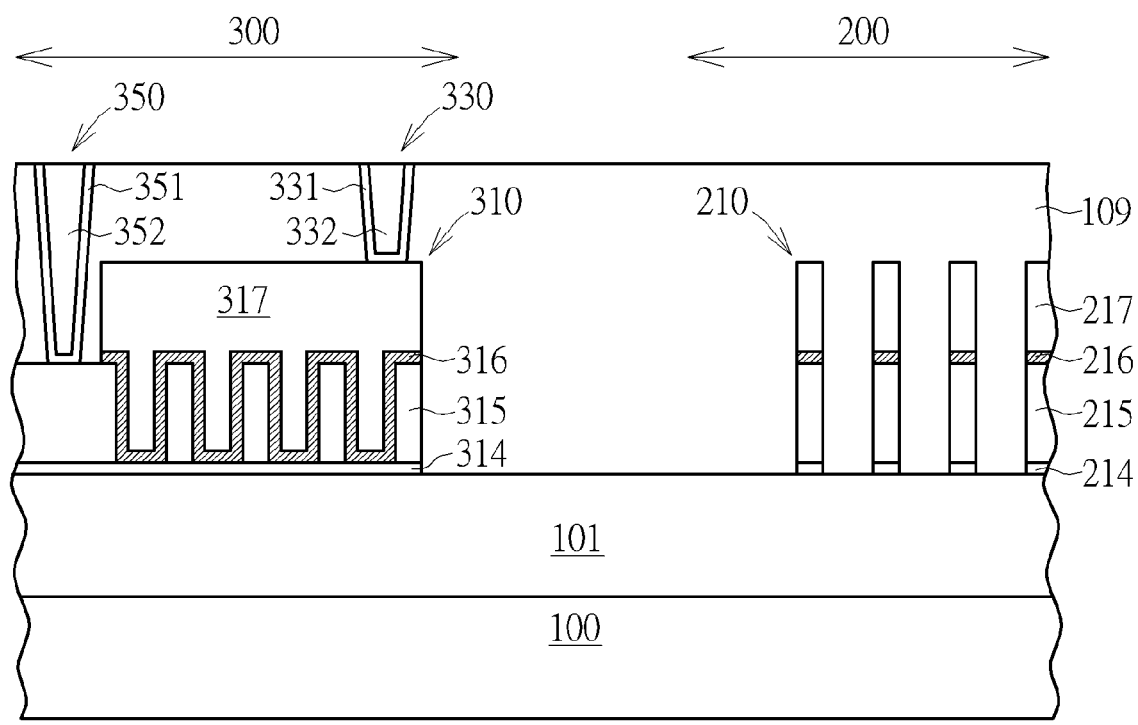
FIG. 8 is a schematic diagram illustrating a method of forming a semiconductor integrated device according to a second embodiment of the present invention.

Please refer to FIG. 8, which is a schematic diagram illustrating a method of forming a semiconductor integrated device according to the second embodiment of the present invention. The formal steps in the present embodiment are substantially similar to those shown in FIG. 1 of the first embodiment, including providing a substrate 100 having the memory cell region 200 and the capacitor region 300 and forming the memory cell device 210 and the capacitor 310 on the memory cell region 200 and the capacitor region 300 of the substrate 100, respectively. The differences between the present embodiment and the aforementioned first embodiment are in that, the memory cell device 210 and the capacitor 310 are both formed on a same STI 101 which is disposed both in the capacitor region 300 and the memory cell region 200 of the substrate 100, as shown in FIG. 8. In this way, the manufacturing process thereof may be further simplified.

Figure 9:
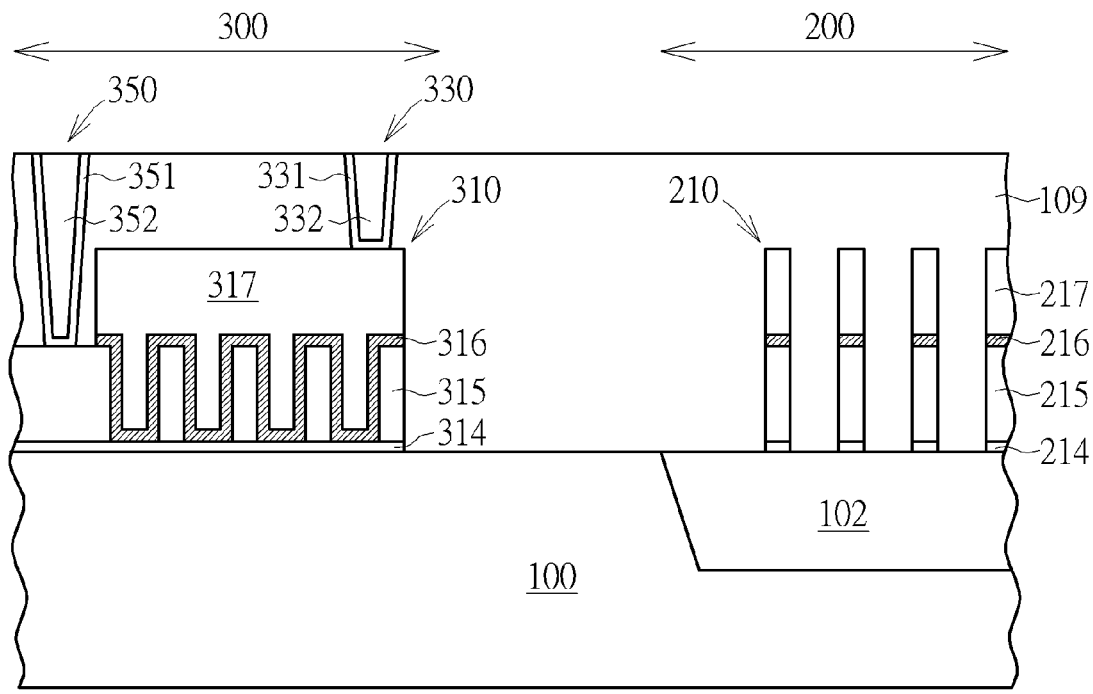
FIG. 9 to FIG. 10 are schematic diagrams illustrating a method of forming a semiconductor integrated device according to a third embodiment of the present invention.
Figure 10:
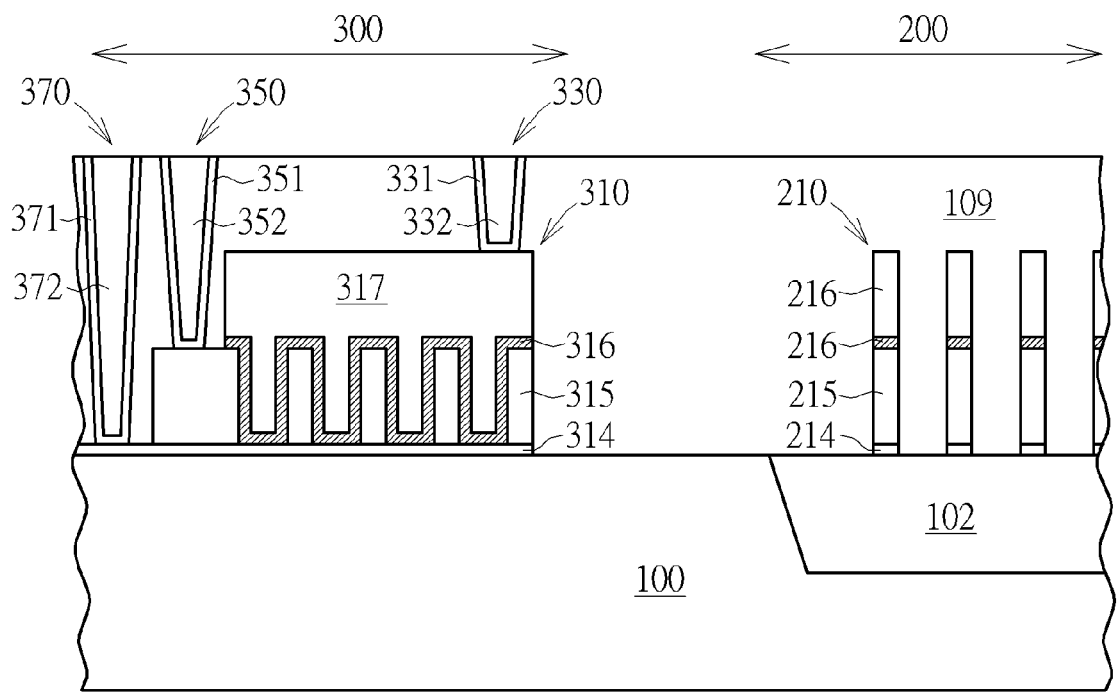

Please refer to FIG. 9 to FIG. 10, which are schematic diagrams illustrating a method of forming a semiconductor integrated device according to the third embodiment of the present invention. The formal steps in the present embodiment are substantially similar to those shown in FIG. 1 of the first embodiment, including providing a substrate 100 having the memory cell region 200 and the capacitor region 300 and forming the memory cell device 210 and the capacitor 310 on the memory cell region 200 and the capacitor region 300 of the substrate 100, respectively. The differences between the present embodiment and the aforementioned first embodiment are in that, the STI 103 formed in the capacitor region 300 of the substrate 100 is omitted, and the capacitor 310 of the present embodiment may directly form on the substrate 100 in the capacitor region 300, thereby directly contacting the substrate 100 or the insulating layer 104 on the substrate 100. In other words, in the embodiment of having the comb-liked bottom electrode (not shown in the drawings), the capacitor may directly contact the insulating layer 104 via the comb-liked bottom electrode thereof; in the embodiment of having the trenched bottom electrode 315a having holes penetrated through the polysilicon layer 105, the capacitor 310 may directly contact the insulating layer 104 not only via the trenched bottom electrode 315a, but also via the ONO layer 316 formed in the holes, as shown in FIG. 8; and in the embodiment of having the trenched bottom electrode having holes penetrated through the polysilicon layer 105 and the insulating layer 104, the capacitor may directly contact the insulating layer 104 and the substrate 100 via the trenched bottom electrode and the ONO layer formed in the holes respectively.

However, the semiconductor integrated device of the present embodiment may not be limited thereto, and in another embodiment, another contact plug 370 (including a barrier layer 371 and a contact metal layer 372) may also be formed to electrically connect the substrate 100, as shown in FIG. 10. Also, in another embodiment (not shown in the drawings), the contact plug 370 may be electrically connected to the contact plug 350, but is not limited thereto. It is noted that, the detailed materials and the forming process of the contact plug 370 are substantially similar to that of the aforementioned contact plugs 330, 350 and will not be further detailed herein.

Overall, the present invention preferably conducts a method of simultaneously forming a PIP capacitor and a memory cell device, either directly formed on the substrate, on the same STI or on different STIs respectively. Through the present invention, the bottom electrode of the PIP capacitor and the first polysilicon gate (namely, the floating gate) of the memory cell device are both formed through the same polysilicon layer, the ONO layers of the PIP capacitor and the memory cell device are formed through the same ONO layers, and the top electrode of the PIP capacitor and the second polysilicon gate (namely, the controlling gate) of the memory cell device are also both formed through the other polysilicon layer. In this way, the present invention is desired to simultaneously form the PIP capacitor and the memory cell device via a streamlined and cost-and-time saving manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor integrated device, comprising:
    a substrate, having a capacitor region and a memory cell region;
    at least one shallow trench isolation disposed in the substrate;
    a memory cell device disposed on the at least one shallow trench isolation in the memory cell region, wherein the memory cell device comprises a tunneling oxide layer, a floating gate, an oxide-nitride-oxide layer, and a control gate sequentially stacked on the at least one shallow trench isolation, and the tunneling oxide layer is disposed between the floating gate and the at least one shallow trench isolation in a projection direction perpendicular to the substrate; and
    a poly-insulator-poly capacitor disposed on the at least one shallow trench isolation in the capacitor region, wherein the poly-insulator-poly capacitor directly contacts a pad oxide layer disposed on the at least one shallow trench isolation, and the poly-insulator-poly capacitor comprises a bottom electrode, another oxide-nitride-oxide layer and a top electrode, wherein the bottom electrode comprises a plurality of holes and a portion of the oxide-nitride-oxide layer of the poly-insulator-poly capacitor is filled in the holes and does not directly contact the at least one shallow trench isolation in the capacitor region.

2. The semiconductor integrated device according to claim 1, wherein the at least one shallow trench isolation includes two different shallow trench isolations, and the poly-insulator-poly capacitor and the memory cell device are disposed on the two shallow trench isolations respectively.

3. The semiconductor integrated device according to claim 1, wherein the at least one shallow trench isolation includes one shallow trench isolation and the poly-insulator-poly capacitor and the memory cell device are disposed on the shallow trench isolation.

4. The semiconductor integrated device according to claim 1, wherein the portion of the oxide-nitride-oxide layer filled in the holes directly contacts the pad oxide layer.

* * * * *